(12) United States Patent
Min

(10) Patent No.: US 12,731,535 B2
(45) Date of Patent: Sep. 8, 2026

(54) MICRO LED DISPLAY DEVICE

(71) Applicant: LG Display Co., Ltd., Seoul (KR)

(72) Inventor: Kyeongtae Min, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/054,282

(22) Filed: Feb. 14, 2025

(65) Prior Publication Data

US 2025/0279042 A1 Sep. 4, 2025

(30) Foreign Application Priority Data

Feb. 29, 2024 (KR) ........................ 10-2024-0029369

(51) Int. Cl.

*G09G 3/32* (2016.01)
*G09G 3/3291* (2016.01)
*H10H 29/30* (2025.01)

(52) U.S. Cl.

CPC ............ *G09G 3/32* (2013.01); *G09G 3/3291* (2013.01); *G09G 2300/0828* (2013.01); *G09G 2320/045* (2013.01); *G09G 2330/021* (2013.01); *G09G 2330/028* (2013.01); *H10H 29/30* (2025.01)

(58) Field of Classification Search

CPC ...... G09G 3/32; G09G 3/3233; G09G 3/3291; G09G 2300/0426; G09G 2300/0809; G09G 2300/0828; G09G 2320/045; G09G 2330/021; G09G 2330/028; H10H 20/83; H10H 29/30

See application file for complete search history.

(56) References Cited

U.S. PATENT DOCUMENTS 9,035,858 B2 * 5/2015 Kim ..................... G09G 3/3258 345/82
11,978,376 B2 5/2024 Hong et al.
12,374,272 B2 * 7/2025 Lee .......................... G09G 3/32
2005/0128193 A1 * 6/2005 Lueder ................. G09G 3/3291 345/207
2007/0024560 A1 * 2/2007 Kim ..................... G09G 3/3655 345/94
2012/0162176 A1 * 6/2012 Kim ..................... G09G 3/3258 345/211
2023/0086380 A1 * 3/2023 Charisoulis ............ G09G 3/006 345/691
2023/0094533 A1 * 3/2023 Krah ..................... G06F 3/0412 345/174
2024/0290236 A1 8/2024 Hong et al.

FOREIGN PATENT DOCUMENTS

KR 10-2023-0121230 A 8/2023

* cited by examiner

*Primary Examiner* — Mihir K Rayan
(74) *Attorney, Agent, or Firm* — Fenwick & West LLP

(57) ABSTRACT

Disclosed is a micro-LED display device configured to prevent unwanted light-emission under all driving conditions regardless of a short circuit between a cathode electrode and an anode electrode of a micro-LED. The micro-LED display device includes a display panel including: a plurality of pixel circuits for driving a plurality of micro-LEDs; and a micro-driver for controlling an operation of each of the plurality of pixel circuits; and a power management circuit configured to manage a level of a bias voltage so that a gap voltage as a difference between a negative voltage and the bias voltage used to selectively drive one of the plurality of micro-LEDs is maintained at a value lower than a threshold voltage of each of the plurality of micro-LEDs.

20 Claims, 7 Drawing Sheets

100
110
CE
Pixel1
Pixel2
Pixel3
Pixel16
Row 1
Row 2
Row 8
120
Row 9
Row 10
Row 16
AEL1
AEL2
X
Y

MICRO LED DISPLAY DEVICE

CROSS-REFERENCE TO RELATED APPLICATION

This application claims priority from Republic of Korea Patent Application No. 10-2024-0029369 filed on Feb. 29, 2024 in the Korean Intellectual Property Office, which is hereby incorporated by reference in its entirety.

BACKGROUND

Field

The present disclosure relates to a micro-LED display device.

Description of Related Art

As modern society is gradually developing into an information society, the demand for home appliances and various portable electronic devices is increasing. In this trend, the demand for lightweight and thin display devices is also increasing.

These display devices are implemented in various forms such as liquid crystal displays (LCDs), organic light-emitting displays (OLEDs), and micro-LED displays (micro light-emitting Diodes: micro LEDs).

Among these display devices, the organic light-emitting displays and the micro-LED displays employ self-luminous elements, and do not require a separate light source such as a backlight used in the liquid crystal displays, and thus may be made thinner or used as the display devices in various forms.

SUMMARY

The micro-LED display device has very high internal quantum efficiency, and displays a high-luminance image while consuming low power. In this trend, development of the micro-LED display device has been actively underway recently.

However, when a micro-LED constituting a pixel is missing due to a process problem, a short circuit may occur between a cathode electrode and an anode electrode, thereby causing other unwanted micro-LEDs to emit abnormally light.

Therefore, a purpose of the present disclosure is to provide a micro-LED display device that may prevent unwanted light-emission under all driving conditions regardless of the short circuit between the cathode electrode and the anode electrode of the micro-LED.

Furthermore, a purpose of the present disclosure is to provide a micro-LED display device that may prevent or at least reduce unwanted light-emission by controlling a gap voltage as a difference between a negative voltage and a bias voltage used to selectively drive one of a plurality of micro-LEDs in a pixel circuit of the micro-LED display panel to be maintained at a value lower than a threshold voltage of the micro-LED.

Furthermore, a purpose of the present disclosure is to provide a micro-LED display device that even when there is a short circuit between the cathode electrode and the anode electrode of the micro-LED display panel, the gap voltage as the difference between the negative voltage and the bias voltage is maintained to be constant, thereby preventing unwanted vertical line emission under all driving conditions.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

One embodiment of the present disclosure provides a micro-LED (light-emitting diode) display device comprising: a display panel including: a plurality of pixel circuits for driving a plurality of micro-LEDs; and a micro-driver for controlling an operation of each of the plurality of pixel circuits; and a power management circuit configured to manage a level of a bias voltage so that a gap voltage as a difference between a negative voltage and the bias voltage used to selectively drive one of the plurality of micro-LEDs is maintained at a value lower than a threshold voltage of each of the plurality of micro-LEDs.

Another embodiment of the present disclosure provides a micro-LED display device comprising: a display panel including: a plurality of pixel circuits for driving a plurality of micro-LEDs; and a micro-driver for controlling an operation of each of the plurality of pixel circuits, wherein the display panel includes: first to 16th row cathode electrodes extending in a row direction of the display panel and arranged so as to be spaced from each other by a predefined spacing in a column direction; and a micro-driver disposed between a column-directional arrangement of the first to 8th row cathode electrodes and a column-directional arrangement of the ninth to 16th row cathode electrodes.

Still another embodiment of the present disclosure provides a micro-LED display device comprising: a display panel including: a plurality of pixel circuits for driving a plurality of micro-LEDs; and a micro-driver for controlling an operation of each of the plurality of pixel circuits, wherein each of the plurality of pixel circuits includes: a driving transistor configured to supply a power voltage in response to a gate driving voltage; a first transistor configured to constitute a current path together with the driving transistor in response to a light-emission signal; first to eighth micro-LEDs, each having an anode electrode connected to the first transistor; and a switch circuit configured to selectively connect each of the cathode electrodes of the first to eighth micro-LEDs to a power line for a negative voltage or a bias voltage.

According to embodiments of the present disclosure, the unwanted emission may be prevented by controlling the gap voltage as the difference between the negative voltage and the bias voltage used to selectively drive one of a plurality of micro-LEDs in a pixel circuit to be maintained at a value lower than the threshold voltage of the micro-LED.

Furthermore, even when there is a short circuit between the cathode electrode and the anode electrode of the micro-LED display panel, the gap voltage as the difference between the negative voltage and the bias voltage is maintained to be constant, thereby preventing unwanted vertical line emission under all driving conditions.

Furthermore, power consumption may be reduced due to the low-power operation of the micro-LED.

The effects of the present disclosure are not limited to the effects mentioned above, and other effects not mentioned will be clearly understood by those skilled in the art from the description below.

DETAILED DESCRIPTION

Figure 1:
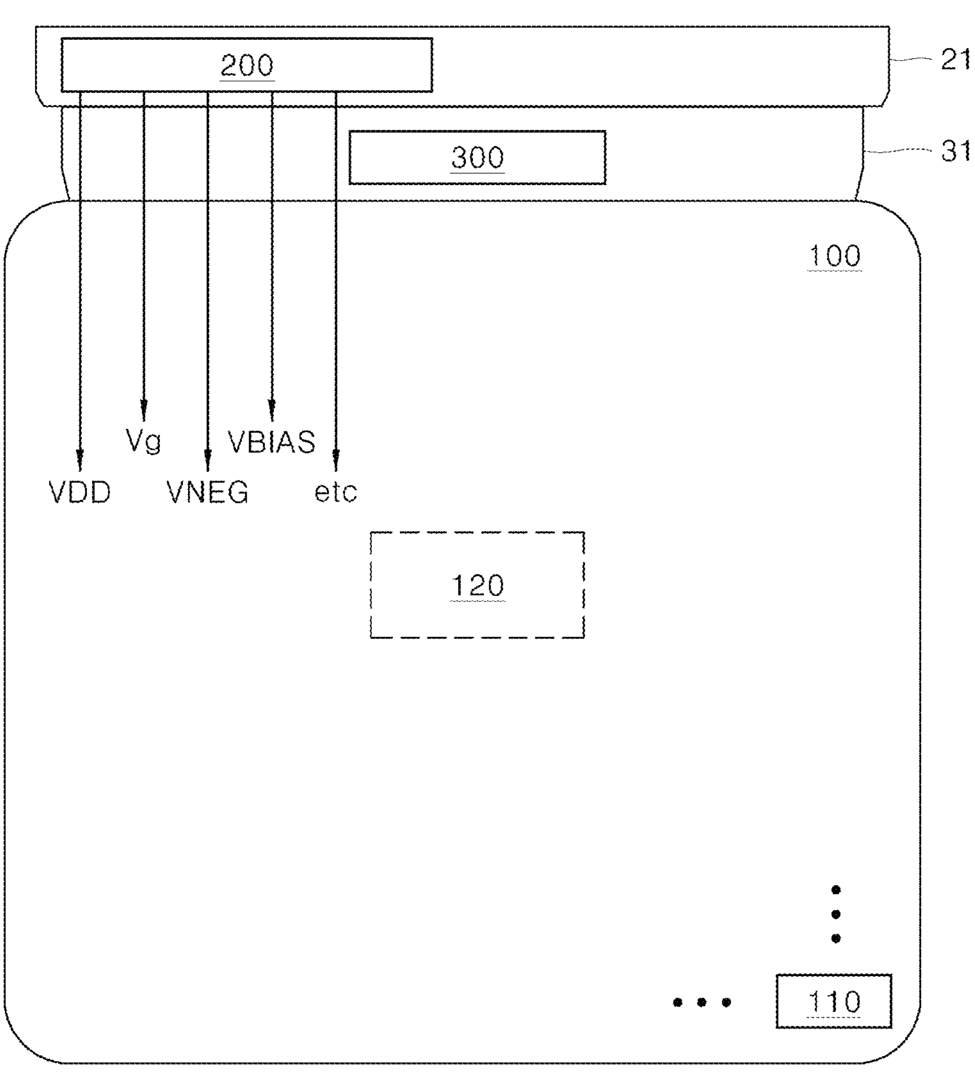
FIG. 1 is a schematic block diagram of a micro-LED display device according to some embodiments of the present disclosure.

Advantages and features of the present disclosure, and a method of achieving the advantages and features will become apparent with reference to embodiments described below in detail together with the accompanying drawings. However, the present disclosure is not limited to the embodiments as disclosed under, but may be implemented in various different forms. Thus, these embodiments are set forth only to make the present disclosure complete, and to entirely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items.

Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when a first element or layer is referred to as being "connected to", or "coupled to" a second element or layer, the first element may be directly connected to or coupled to the second element or layer, or one or more intervening elements or layers may be present therebetween. In addition, it will also be understood that when an element or layer is referred to as being "between" two elements or layers, it may be the only element or layer between the two elements or layers, or one or more intervening elements or layers may also be present therebetween.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or periods, these elements, components, regions, layers and/or periods should not be limited by these terms. These terms are used to distinguish one element, component, region, layer or section from another element, component, region, layer or section. Thus, a first element, component, region, layer or section as described under could be termed a second element, component, region, layer or section, without departing from the spirit and scope of the present disclosure.

When an embodiment may be implemented differently, functions or operations specified within a specific block may be performed in a different order from an order specified in a flowchart. For example, two consecutive blocks may actually be performed substantially simultaneously, or the blocks may be performed in a reverse order depending on related functions or operations.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description as set forth below have been selected as being general and universal in the related technical field. However, there may be other terms than the terms depending on the development and/or change of technology, convention, preference of technicians, etc. Therefore, the terms used in the description as set forth below should not be understood as limiting technical ideas, but should be understood as examples of the terms for illustrating embodiments.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly connected to, or coupled to the other element or layer, or one or more intervening elements or layers may be present therebetween. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Further, in a specific case, a term may be arbitrarily selected by the applicant, and in this case, the detailed meaning thereof will be described in a corresponding description period. Therefore, the terms used in the description as set forth below should be understood based on not simply the name of the terms, but the meaning of the terms and the contents throughout the detailed description.

In description of flow of a signal, for example, when a signal is delivered from a node A to a node B, this may include a case where the signal is transferred from the node A to the node B via another node unless a phrase 'immediately transferred' or 'directly transferred' is used.

Throughout the present disclosure, "A and/or B" means A, B, or A and B, unless otherwise specified, and "C to D" means C inclusive to D inclusive unless otherwise specified.

Hereinafter, a display device according to each of embodiments of the present disclosure is described with reference to the attached drawings. In describing an embodiment, descriptions of components in a corresponding embodiment identical with or similar to those of previous embodiments will be omitted.

Hereinafter, a micro-LED display device according to some embodiments will be described.

FIG. 1 is a schematic block diagram of a micro-LED display device according to some embodiments of the present disclosure.

The micro-LED display device may include a display panel 100 including a micro-driver 120, a power management circuit 200, and a timing controller 300.

The display panel 100 may include a plurality of pixel circuits 110 and the micro-driver 120 for driving the plurality of pixel circuits 100. The plurality of pixel circuits 110 may receive voltages such as a power supply voltage VDD, a gate driving voltage Vg, a negative voltage VNEG, a bias voltage VBIAS, and others etc from the power management circuit 200.

In this regard, the power supply voltage VDD, the gate driving voltage Vg, the negative voltage VNEG, and the bias voltage VBIAS may be used to drive the plurality of micro-LEDs provided in the pixel circuit 110. In particular, the negative voltage VNEG and the bias voltage VBIAS may be used to selectively drive one of the plurality of micro-LEDs.

The micro-LED may mean an LED having one side of a size of 100 μm or smaller. This size corresponds to a size of about 1/10 or smaller of a size of a general LED. The micro-LED is known to have energy efficiency higher by about 20% than that of the general LED, and have the advantage of low heat generation and low power consumption due to the small size thereof.

The power management circuit 200 may generate voltages such as a power supply voltage VDD, a gate driving voltage Vg, a negative voltage VNEG, a bias voltage VBIAS, and others, and may provide them to the micro-driver 120 and at least one of a plurality of pixel circuits 110 of the display panel 100. For example, the power supply voltage VDD, the gate driving voltage Vg, the negative voltage VNEG, and the bias voltage VBIAS may be applied from the power management circuit 200 to each micro-driver 120 through an individual power line. The power management circuit 200 may be disposed on a flexible printed circuit board (FPCB) 21.

In this regard, the power management circuit 200 may manage the potential of the gap voltage as the difference between the negative voltage VNEG and the bias voltage VBIAS to be maintained at a constant value lower than the threshold voltage of the micro-LED. The power management circuit 200 may supply the negative voltage VNEG to the display panel 100 and generate the bias voltage VBIAS using a negative feedback voltage VNEG_FB fed back from the display panel 100 and a preset gap voltage.

The timing controller 300 may receive image data from a host system (not shown) and may receive timing signals such as a vertical synchronization signal, a horizontal synchronization signal, a data enable signal, and a main clock. The timing controller 300 may convert the image data so as to have a format suitable for a size and a resolution of the display panel 100 and provide the converted data to the micro-driver 120. The timing controller 300 may be disposed on a film 31 connecting the FPCB 21 and the display panel 100 to each other.

Figure 2:
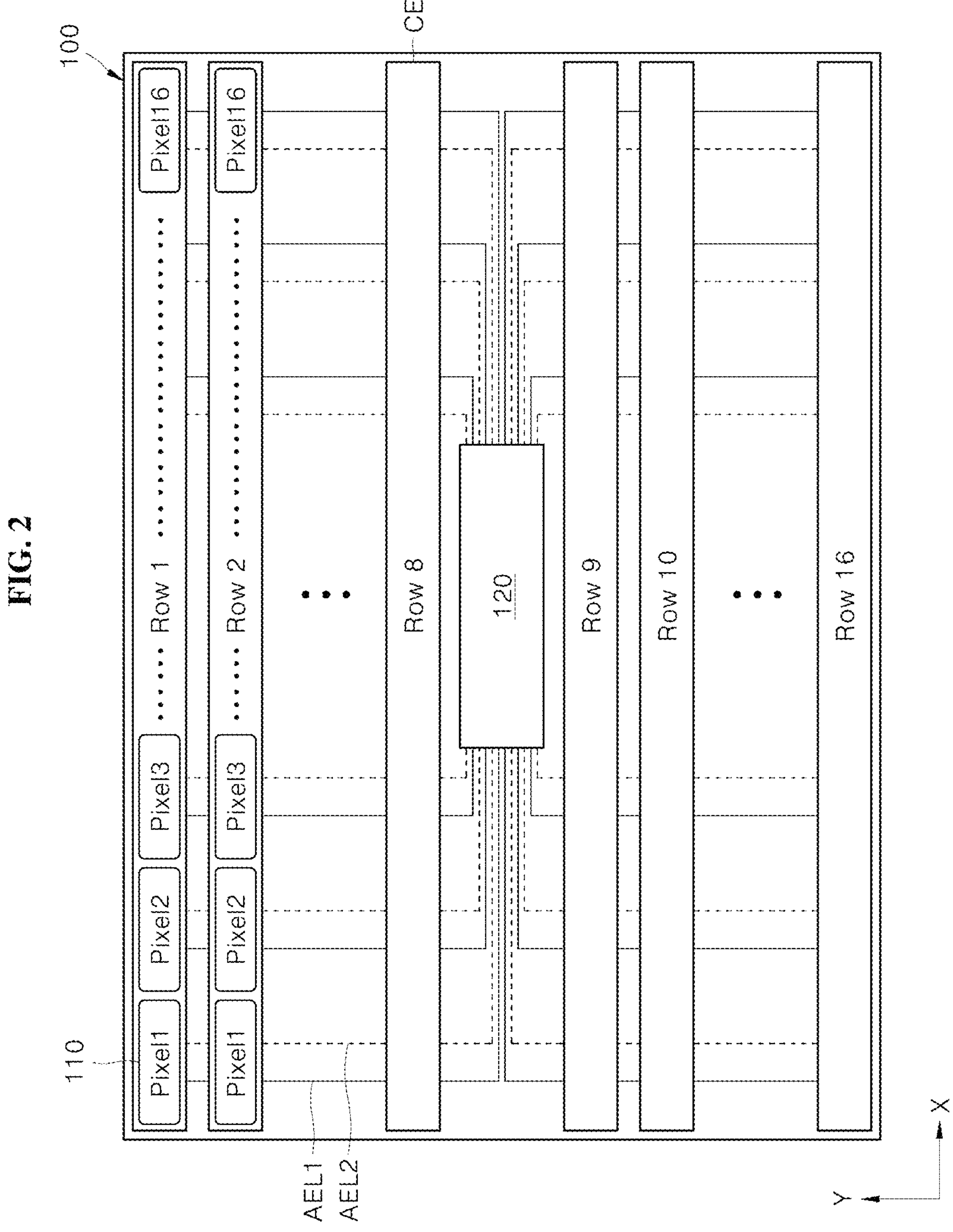
FIG. 2 is a block diagram of a micro-LED display panel according to some embodiments of the present disclosure.

FIG. 2 is a block diagram of a micro-LED display panel according to some embodiments of the present disclosure.

Referring to FIG. 2, the display panel 100 may include first to 16th row cathode electrodes Row1 to Row16, the micro-driver 120, and the plurality of pixel circuits 110.

The first to 16th row cathode electrodes Row1 to Row16 are cathode electrodes CE of micro-LEDs, and may extend in an X-axis direction of the display panel 100 and be arranged so as to be spaced from each other by a predetermined spacing in the Y-axis direction. The plurality of pixel circuits 110 may disposed on each of the first to 16th row cathode electrodes Row1 to Row16 and may be arranged so as to be spaced from each other by a predetermined spacing in the X-axis direction. As used herein, the X-axis direction may be a row direction, while a Y-axis direction may be a column direction. For example, the first to 16th pixel circuits may be disposed on each of the first to 16th row cathode electrodes Row1 to Row16 and may be arranged in a column.

The micro-driver 120 may be disposed between a column directional arrangement of the first to 8th row cathode electrodes Row1 to Row8 and a column directional arrangement of the ninth to 16th row cathode electrodes Row9 to Row16. That is, in the column direction, the micro-driver 120 may be disposed between the first to 8th row cathode electrodes Row1 to Row8 and the ninth to 16th row cathode electrodes Row9 to Row16, as shown in FIG. 2.

The micro-driver 120 may be connected to each of the plurality of pixel circuits 110 via a first anode electrode line AEL1 and a second anode electrode line AEL2. The first anode electrode line AEL1 may be connected to an anode electrode of the micro-LED of each of the plurality of pixel circuits 110. The second anode electrode line AEL2 may be connected to the anode electrode of a redundancy micro-LED of each of the plurality of pixel circuits 110.

For example, first to eighth micro-LEDs connected to the micro-driver 120 via the first anode electrode lines AEL1 may be included in the plurality of pixel circuits 110, respectively. First to eighth redundancy micro-LEDs connected to the micro-driver 120 via the second anode electrode lines AEL2 may be included in the plurality of pixel circuits 110, respectively.

The redundancy micro-LED may operate in place of the micro-LED when a defect occurs in the micro-LED. Although not shown in the drawing, in the pixel area of the display panel 100 where the pixel circuits 110 are disposed, not only gate lines, data lines, and thin-film transistors for implementing the micro-LEDs are formed, but also separate redundancy gate lines, redundancy data lines, and redundancy thin-film transistors for driving the redundancy micro-LEDs may be formed.

For example, each of the first to eighth micro-LEDs and each of the first to eighth redundancy micro-LEDs may operate separately using different thin-film transistors driven based on signals input thereto through different paths.

For example, each micro-driver 120 may drive 16×16 pixel circuits 110. FIG. 2 illustrates one micro-driver 120. However, this is for convenience of illustration. A plurality of micro-drivers 120 may be disposed and arranged on the display panel 100, and 16×16 pixel circuits 110 may be connected to each of the plurality of micro-drivers 120.

For example, the anode electrode of the micro-LED may share a source pad of one micro-driver 120 in an 8×1 configuration.

For example, the cathode electrode of the micro-LED may share one cathode electrode in a 1×16 configuration.

For example, only one row in the column directional arrangement of the first to eighth row cathode electrodes Row1 to Row8 and only one row in the column directional arrangement of the ninth to sixteenth row cathode electrodes Row9 to Row16 may be driven at the same time point. The negative voltage VNEG may be applied to the cathode electrode of the row being driven, and the bias voltage VBIAS may be applied to the cathode electrode of the row not being driven.

In this regard, the bias voltage VBIAS may be set to a voltage higher than the negative voltage VNEG, and may play a role in preventing a forward voltage of the micro-LED from exceeding the threshold voltage of the micro-LED during a time other than a light-emission time.

Figure 3:
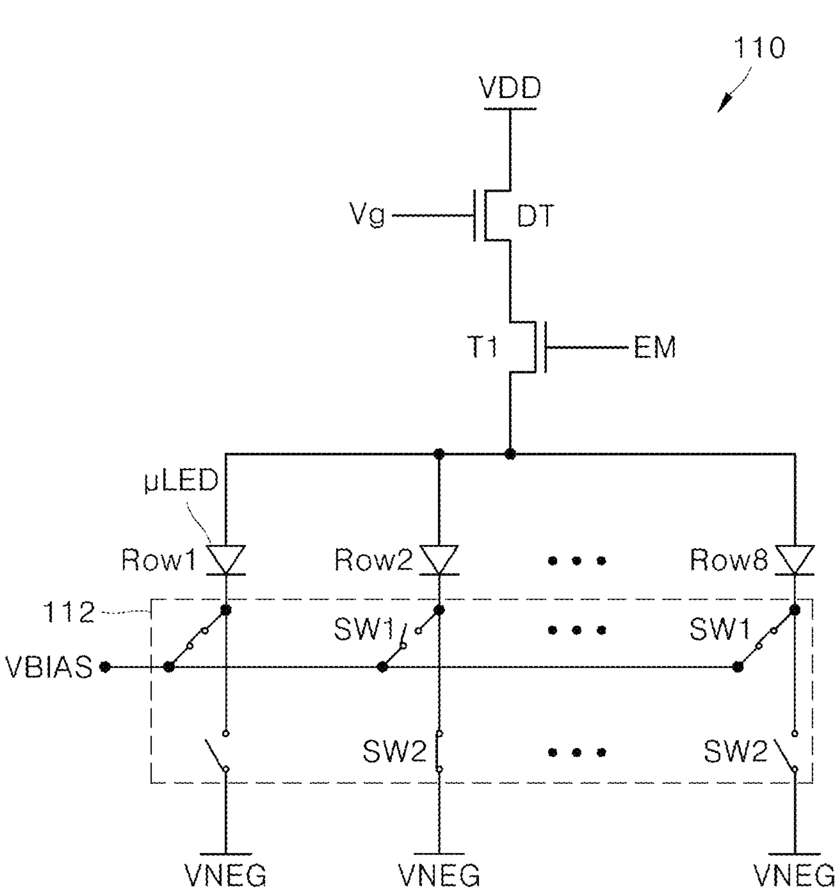
FIG. 3 is a pixel circuit diagram of a micro-LED display device according to some embodiments of the present disclosure.

FIG. 3 is a pixel circuit diagram of a micro-LED display device according to some embodiments of the present disclosure.

Referring to FIG. 3, each of the plurality of pixel circuits 110 may include a driving transistor DT, a first transistor T1, first to eighth micro-LEDs, and a switch circuit 112.

The driving transistor DT is connected to a power voltage line to which a power voltage VDD is applied, and is configured to supply the power voltage VDD to the anode electrodes of the first to eighth micro-LEDs in response to a gate driving voltage Vg. The driving transistor DT may be embodied as a thin-film transistor.

The first transistor T1 is connected to and disposed between the driving transistor DT and the anode electrodes of the first to eighth micro-LEDs. The first transistor T1 together with the driving transistor DT constitutes a current path in response to an emission signal EM. The first transistor T1 may be embodied as a thin-film transistor and may be formed in the same layer as a layer of the driving transistor DT and within a backplane of the display panel 100. In this regard, a pulse width of the emission signal EM may be controlled by the micro-driver 120.

The anode electrodes of the first to eighth micro-LEDs may be commonly connected to the electrode of the first transistor T1. Each of the cathode electrodes of the first to eighth micro-LEDs may be selectively connected to a power line to which a negative voltage VNEG is applied, or a power line to which a bias voltage VBIAS is applied via the switch circuit 112. The first to eighth micro-LEDs may be respectively micro-LEDs respectively corresponding to the first row Row1 to the eighth row Row8.

The switch circuit 112 includes first switches SW1 and second switches SW2.

Each of the first switches SW1 connects each of the cathode electrodes of the first to eighth micro-LEDs to the power line to which the bias voltage VBIAS is applied. Each of the second switches SW2 connects each of the cathode electrodes of the first to eighth micro-LEDs to the power line to which the negative voltage VNEG is applied.

Each of the second switches SW2 of the switch circuit 112 may apply the negative voltage VNEG to the cathode electrode of the micro-LED which is intended to emit light. Each of the first switches SW1 may apply the bias voltage VBIAS to the cathode electrode of each of the remaining micro-LEDs which are intended not to emit light. As used herein, "intended to emit light" means being designed to emit light and "intended not to emit light" means being designed not to emit light.

For example, as shown in FIG. 2 and FIG. 3, when the micro-LED of the second row Row2 is intended to emit light, the first switch SW1 connected to the micro-LED of the second row Row2 is turned off, the second switch SW2 connected to the micro-LED of the second row Row2 is turned on, and the first switches SW1 respectively connected to the micro-LEDs of the first row Row1, and the third row Row3 to the eighth row Row8 are turned on, and the second switches SW2 respectively connected to the micro-LEDs of the first row Row1 and the third row Row3 to the eighth row Row8 are turned off. In this way, the negative voltage VNEG is applied to the cathode electrode of the micro-LED which is intended to emit light, while the bias voltage VBIAS is applied to the cathode electrodes of the remaining micro-LEDs to cause one target micro-LED among the plurality of micro-LEDs to emit light.

For example, the pixel circuit may be composed of one transistor T1 that is driven in response to one emission signal EM that controls an emission time per one driving transistor DT, and eight micro-LEDs. The switch circuit 112 may be designed so that the negative voltage VNEG or the bias VBIAS is applied to the cathode electrode of the micro-LED depending on whether or not the micro-LED emits light.

Figure 4:
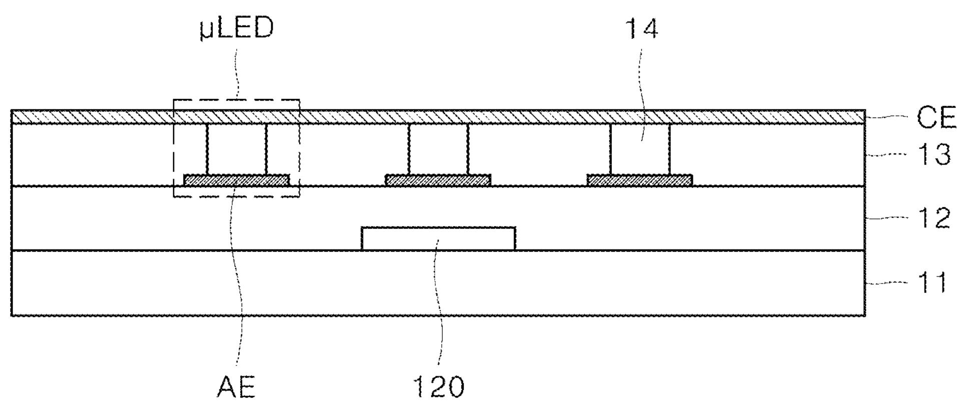
FIG. 4 is a schematic cross-sectional diagram of a micro-LED display panel according to some embodiments of the present disclosure.

FIG. 4 is a schematic cross-sectional view of a micro-LED display panel according to some embodiments of the present disclosure.

A micro-driver 120 may be formed on a substrate 11, an insulating layer 12 may be formed on the substrate 11 and the micro-driver 120, and a micro-LED layer AE, 13, 14, and CE may be formed on the insulating layer 12. The micro-LED layer may include an anode electrode AE, a light-emitting layer 14, and a cathode electrode CE. A bank layer 13 may be formed between adjacent pixels to prevent optical interference between adjacent micro-LEDs.

FIG. 4 is a schematic cross-sectional view. A transistor layer in which the thin-film transistors such as the driving transistor DT and the first transistor T1 are formed may be further formed between the insulating layer 12 and the bank layer 13.

Figure 5:
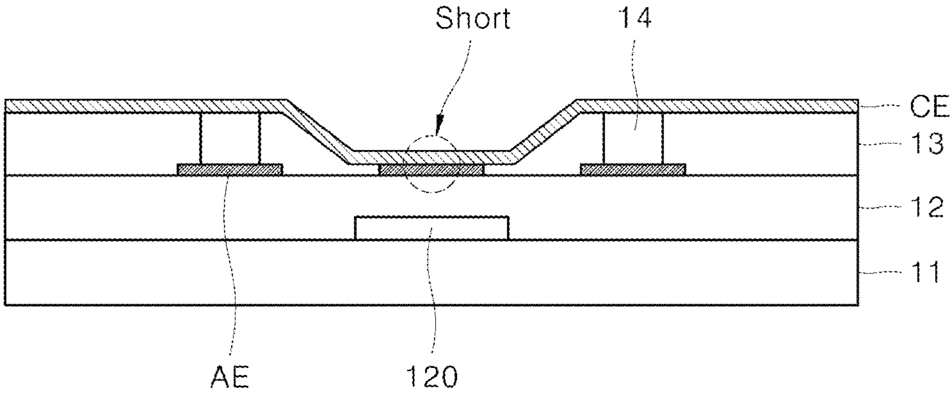
FIG. 5 is a diagram showing occurrence of a short circuit between anode and cathode electrodes in a micro-LED display panel according to some embodiments of the present disclosure.

FIG. 5 is a drawing showing occurrence of a short circuit between the anode and cathode electrodes in a micro-LED display panel according to some embodiments of the present disclosure.

When the micro-LED is missing due to a process problem, a short circuit may occur between the anode electrode AE and the cathode electrode CE during deposition of the cathode electrode CE. The potential of the bias voltage VBIAS is low such that the gap between the negative voltage VNEG and the bias voltage VBIAS is small. In this case, even when there is the short circuit between the anode and the cathode electrodes, the bias voltage VBIAS applied to the anode electrode through the short path does not exceed the threshold voltage of the micro-LED, so that the micro-LED may operate in a normal manner.

However, the potential of the bias voltage VBIAS is high such that the gap between the negative voltage VNEG and the bias voltage VBIAS is large. In this case, the bias voltage VBIAS applied to the anode electrode through the short path exceeds the threshold voltage of the micro-LED, so that the micro-LED emits light while the row thereof is selected.

Since eight micro-LEDs share the source pad of one micro-driver, the micro-LEDs that emit light in an abnormal manner due to the short circuit between the anode electrode and the cathode electrode may be recognized by the naked eye as a vertical line of the eight pixels due to the frequency of the fast emission signal EM and the row selection.

Figure 6:
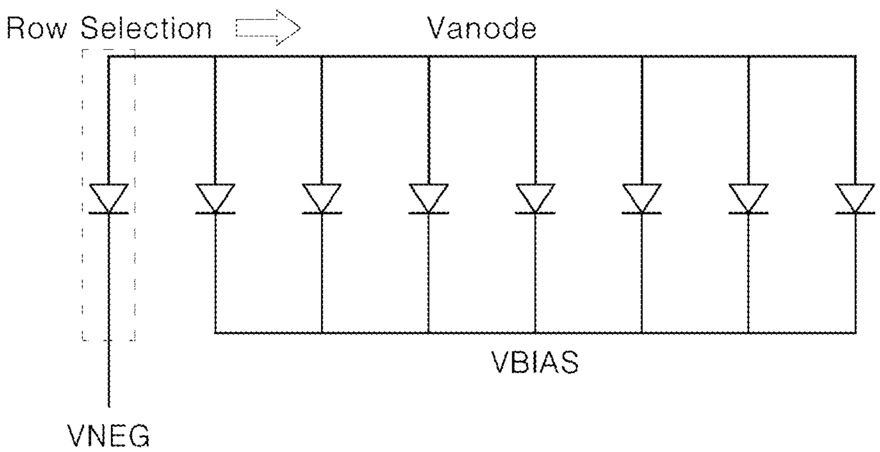
FIG. 6 is a circuit diagram showing an operation of a pixel circuit of a micro-LED display device according to some embodiments of the present disclosure.

FIG. 6 is a circuit diagram showing the operation in a normal state without the short between the anode electrode and the cathode electrode in the pixel circuit of the micro-LED display device according to some embodiments of the present disclosure.

The negative voltage VNEG is applied to the cathode electrode of the first micro-LED which is intended to emit light, and a bias voltage VBIAS is applied to each of the cathode electrodes of the remaining second to eighth micro-LEDs, thereby causing the first micro-LED among the first to eighth micro-LEDs to emit light. In FIG. 6, Vanode indicates the anode voltage applied to the micro LED.

Figure 7:
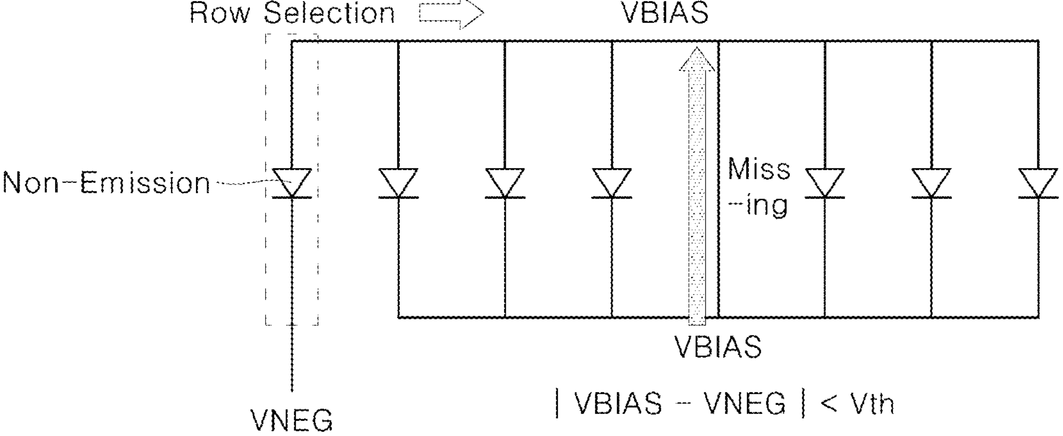
FIG. 7 and FIG. 8 are circuit diagrams showing an operation in an event of missing of a micro-LED in a pixel circuit according to some embodiments of the present disclosure.
Figure 8:
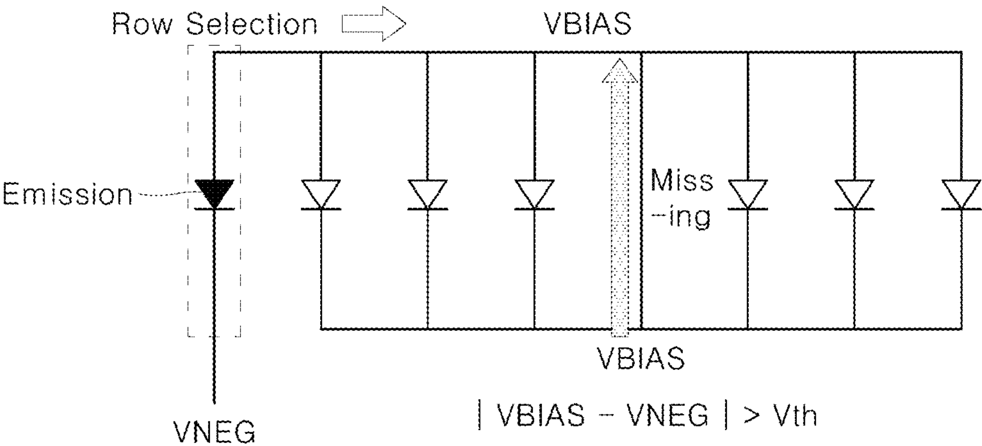

FIG. 7 and FIG. 8 are circuit diagrams showing the operation when the short circuit occurs between the anode electrode and the cathode electrode in the pixel circuit according to some embodiments of the present disclosure.

In this regard, FIG. 7 shows the operation when the gap voltage corresponding to the difference between the negative voltage VNEG and the bias voltage VBIAS is lower than the threshold voltage Vth of the micro-LED.

For example, when the negative voltage VNEG is −5 V, the bias voltage VBIAS is −3.6V, and the threshold voltage Vth of the micro-LED is 1.5 V, the potential difference between the negative voltage VNEG and the bias voltage VBIAS is 1.4V which is lower than the threshold voltage Vth of the micro-LED of 1.5 V, so that the micro-LED does not emit light, as shown in FIG. 7.

FIG. 8 shows the operation when the gap voltage corresponding to the difference between the negative voltage VNEG and the bias voltage VBIAS is higher than the threshold voltage Vth of the micro-LED.

For example, when the negative voltage VNEG is −5 V, the bias voltage VBIAS is −2.6V, and the threshold voltage Vth of the micro-LED is 1.5 V, the potential difference between the negative voltage VNEG and the bias voltage VBIAS is 2.4V which is higher than the threshold voltage Vth of 1.5 V of the micro-LED, so that the micro-LED emits light abnormally as shown in FIG. 8.

The micro-LED display device according to the embodiment of the present disclosure may be configured to manage the potential of the gap voltage as the difference between the negative voltage VNEG and the bias voltage VBIAS to be maintained at a constant value lower than the threshold voltage Vth of the micro-LED, thereby preventing or at least reducing unwanted vertical line emission even when there is the short circuit between the cathode electrode and the anode electrode.

According to some embodiments, the power management circuit 200 may be configured to receive the negative voltage VNEG as a feedback and to generate the bias voltage VBIAS based on the feedback so that the potential of the gap voltage as the difference between the negative voltage VNEG and the bias voltage VBIAS is maintained at a constant value lower than the threshold voltage Vth of the micro-LED. This is described in more detail with reference to FIG. 9 as follows.

Figure 9:
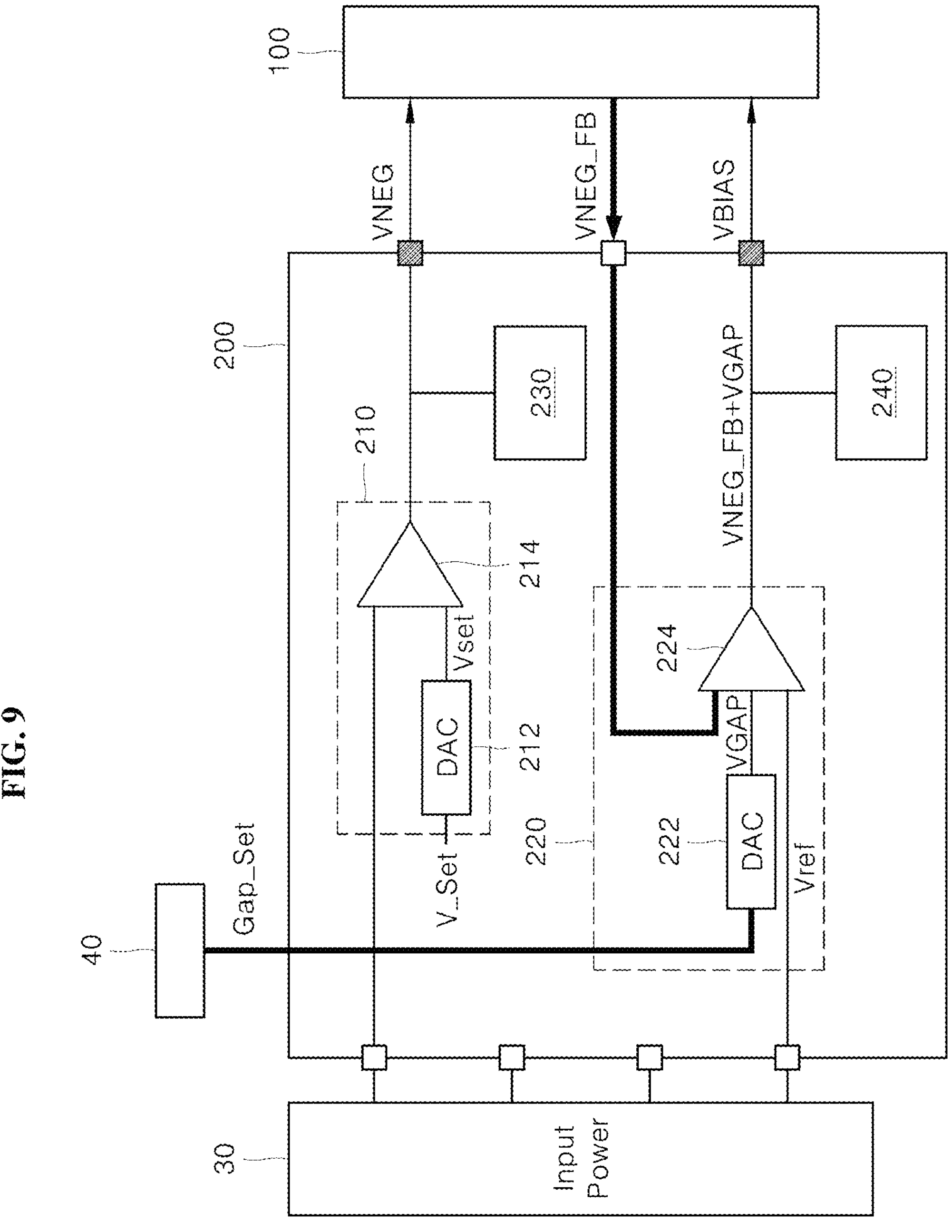
FIG. 9 is a block diagram of a power management circuit in a micro-LED display device according to some embodiments of the present disclosure.

FIG. 9 is a block diagram of the power management circuit in a micro-LED display device according to some embodiments of the present disclosure.

Referring to FIG. 9, the power management circuit 200 may include a first voltage generation circuit 210 and a second voltage generation circuit 220.

The first voltage generation circuit 210 may generate the negative voltage VNEG based on an input voltage input from an external input power supply 30 and a voltage setting signal V_Set. The first voltage generation circuit 210 may include a digital-to-analog converter (DAC) 212 and a computation circuit 214.

The digital-to-analog converter 212 of the first voltage generation circuit 210 may receive the voltage setting signal V_Set for setting a level of the negative voltage VNEG from an external setting unit 40. In this regard, the voltage setting signal V_Set is a digital signal. Furthermore, the voltage setting signal V_Set may be an internally preset signal.

The digital-to-analog converter 212 of the first voltage generation circuit 210 may convert the voltage setting signal V_Set into a corresponding set voltage Vset. The computation circuit 214 of the first voltage generation circuit 210 may perform computation on the set voltage Vset and the input voltage to generate the negative voltage VNEG.

The second voltage generation circuit 220 may generate the bias voltage VBIAS based on a reference voltage Vref input from the external input power supply 30, a gap setting signal Gap_Set, and a negative feedback voltage VNEG_FB.

The second voltage generation circuit 220 may include a digital-to-analog converter 222 that receives the gap setting signal Gap_Set from the external setting unit 40, and converts the gap setting signal Gap_Set into a gap voltage VGAP, and an computation circuit 224 that performs computation on the reference voltage Vref, the gap voltage VGAP, and the negative feedback voltage VNEG_FB to generate the bias voltage VBIAS.

The gap setting signal Gap_Set may be defined as a digital signal that allows the gap voltage VGAP to be set to a value lower than the threshold voltage of the micro-LED.

A power line for transmitting the negative voltage VNEG from the first voltage generation circuit 210 to the display panel 100 and a power line for transmitting the bias voltage VBIAS from the second voltage generation circuit 220 to the display panel 100 may be connected to electrostatic discharge circuits 230 and 240, respectively.

For example, the power management circuit 200 may be configured to receive the negative feedback voltage VNEG_FB about the negative voltage VNEG from the display panel 100, and may feedback the negative feedback voltage VNEG_FB to an input of the second voltage generation circuit 220 configured to generate the bias voltage VBIAS to generate the bias voltage VBIAS.

For example, the gap setting signal Gap_Set may be set based on the characteristics of the micro-LED display panel and may be transmitted to the input of a second voltage generation circuit 220 configured to generate the bias voltage VBIAS set such that the gap voltage VGAP is below the threshold voltage of the micro-LED. That is, the potential of the difference between the negative voltage VNEG and the bias voltage VBIAS may be set to a value below the threshold voltage of the micro-LED.

In one example, the second voltage generation circuit 220 may set the level of the bias voltage VBIAS based on the gap setting signal Gap_Set and the negative feedback voltage VNEG_FB, and output the bias voltage VBIAS.

In one example, the bias voltage VBIAS generated based on the gap setting signal Gap_Set and the negative feedback voltage VNEG_FB may allow the set gap voltage to be maintained at the same level, regardless of the change in the setting of the negative voltage VNEG or the level of the negative voltage VNEG changing due to the load of the display panel 100. This enables the operation of the display panel 100 in a state where the gap voltage between the negative voltage VNEG and the bias voltage VBIAS is maintained to be a value below the threshold voltage of the micro-LED. This may prevent abnormal light-emission under all driving conditions.

In this way, the power management circuit 200 may manage the gap voltage potential as the difference between the negative voltage VNEG and the bias voltage VBIAS, to be maintained at a constant value lower than the threshold voltage of the micro-LED, and may generate the bias voltage VBIAS using the negative feedback voltage VNEG_FB fed back from the display panel 100 and the preset gap voltage According to embodiments of the present disclosure, the unwanted emission may be prevented by controlling the gap voltage as the difference between the negative voltage and the bias voltage used to selectively drive one of a plurality of micro-LEDs in a pixel circuit to be maintained at a value lower than the threshold voltage of the micro-LED.

Furthermore, even when there is a short circuit between the cathode electrode and the anode electrode of the micro-LED display panel, the gap voltage as the difference between the negative voltage and the bias voltage is maintained to be constant, thereby preventing or at least reducing unwanted vertical line emission under all driving conditions.

Furthermore, power consumption may be reduced due to the low-power operation of the micro-LED.

A first aspect of the present disclosure provides a micro-LED (light-emitting diode) display device comprising: a display panel including: a plurality of pixel circuits for driving a plurality of micro-LEDs; and a micro-driver for controlling an operation of each of the plurality of pixel circuits; and a power management circuit configured to manage a level of a bias voltage so that a gap voltage as a difference between a negative voltage and the bias voltage used to selectively drive one of the plurality of micro-LEDs is maintained at a value lower than a threshold voltage of each of the plurality of micro-LEDs.

In accordance with some embodiments of the first aspect, the power management circuit is configured to generate the negative voltage and provide the generated negative voltage to the display panel and is configured to generate the bias voltage based on a negative feedback voltage fed back from the display panel and a gap setting signal corresponding to the gap voltage.

In accordance with some embodiments of the first aspect, the power management circuit includes: a first voltage generation circuit configured to generate the negative voltage based on an input voltage input from an external input power supply and a voltage setting signal; and a second voltage generation circuit configured to generate the bias voltage based on a reference voltage input from the external input power supply, the gap setting signal, and the negative feedback voltage.

In accordance with some embodiments of the first aspect, the second voltage generation circuit includes: a digital-to-analog converter configured to receive the gap setting signal from an external setting unit and to convert the gap setting signal into the gap voltage; and a computation circuit configured to perform computation on the reference voltage, the gap voltage, and the negative feedback voltage to generate the bias voltage.

In accordance with some embodiments of the first aspect, the display panel includes: first to 16th row cathode electrodes arranged so as to be spaced from each other by a predetermined spacing in a column direction, wherein each of first to 16th row cathode electrodes extends in a row direction of the display panel; and the micro-driver is disposed between a column-directional arrangement of the first to 8th row cathode electrodes and a column-directional arrangement of the ninth to 16th row cathode electrodes.

In accordance with some embodiments of the first aspect, the plurality of pixel circuits are disposed on each of the first to 16th row cathode electrodes, and are arranged so as to be spaced from each other by a predetermined spacing in a row direction.

In accordance with some embodiments of the first aspect, the micro-driver is connected to each of the plurality of pixel circuits via first and second anode electrode lines.

In accordance with some embodiments of the first aspect, the plurality of pixel circuits include: first to eighth micro-LEDs connected to the micro-driver via the first anode electrode lines, respectively; and first to eighth redundancy micro-LEDs connected to the micro-driver via the second anode electrode lines, respectively.

In accordance with some embodiments of the first aspect, each of the plurality of pixel circuits includes: a driving transistor configured to supply a power voltage in response to a gate driving voltage; a first transistor configured to constitute a current path together with the driving transistor in response to a light-emission signal; first to eighth micro-LEDs, each having an anode electrode connected to the first transistor; and a switch circuit configured to selectively connect each of the cathode electrodes of the first to eighth micro-LEDs to a power line of the negative voltage or the bias voltage.

In accordance with some embodiments of the first aspect, the switch circuit includes: one or more first switches, each of the first switches being configured to connect each of the cathode electrodes of the first to eighth micro-LEDs to a power line of the bias voltage; and one or more second switches, each of the second switches being configured to connect each of the cathode electrodes of the first to eighth micro-LEDs to a power line of the negative voltage.

In accordance with some embodiments of the first aspect, the switch circuit is configured to apply the negative voltage to the cathode electrode of the micro-LED intended to emit light, and to apply the bias voltage to the cathode electrode of each of remaining micro-LEDs intended not to emit light.

A second aspect of the present disclosure provides a micro-LED display device comprising: a display panel including: a plurality of pixel circuits for driving a plurality of micro-LEDs; and a micro-driver for controlling an operation of each of the plurality of pixel circuits, wherein the display panel includes: first to 16th row cathode electrodes extending in a row direction of the display panel and arranged so as to be spaced from each by a predefined spacing in a column direction; and a micro-driver disposed between a column-directional arrangement of the first to 8th row cathode electrodes and a column-directional arrangement of the ninth to 16th row cathode electrodes.

In accordance with some embodiments of the second aspect, the micro-LED display device further comprises a power management circuit configured to manage a level of a bias voltage so that a gap voltage as a difference between a negative voltage and the bias voltage used to selectively drive one of the plurality of micro-LEDs is maintained at a value lower than a threshold voltage of each of the micro-LEDs.

In accordance with some embodiments of the second aspect, the power management circuit is configured to generate the negative voltage and provide the generated negative voltage to the display panel, and is configured to generate the bias voltage based on a negative feedback voltage fed back from the display panel and a gap setting signal corresponding to the gap voltage.

In accordance with some embodiments of the second aspect, the power management circuit includes: a first voltage generation circuit configured to generate the negative voltage based on an input voltage input from an external input power supply and a voltage setting signal; and a second voltage generation circuit configured to generate the bias voltage based on a reference voltage input from the external input power supply, the gap setting signal, and the negative feedback voltage.

In accordance with some embodiments of the second aspect, the second voltage generation circuit includes: a digital-to-analog converter configured to receive the gap setting signal from an external setting unit and to convert the gap setting signal into the gap voltage; and a computation circuit configured to perform computation on the reference voltage, the gap voltage, and the negative feedback voltage to generate the bias voltage.

A third aspect of the present disclosure provides a micro-LED display device comprising: a display panel including: a plurality of pixel circuits for driving a plurality of micro-LEDs; and a micro-driver for controlling an operation of each of the plurality of pixel circuits, wherein each of the plurality of pixel circuits includes: a driving transistor configured to supply a power voltage in response to a gate driving voltage; a first transistor configured to constitute a current path together with the driving transistor in response to a light-emission signal; first to eighth micro-LEDs, each having an anode electrode connected to the first transistor; and a switch circuit configured to selectively connect each of the cathode electrodes of the first to eighth micro-LEDs to a power line of a negative voltage or a bias voltage.

In accordance with some embodiments of the third aspect, the switch circuit is configured to apply the negative voltage to the cathode electrode of the micro-LED intended to emit light, and to apply the bias voltage to the cathode electrode of each of remaining micro-LEDs intended not to emit light.

In accordance with some embodiments of the third aspect, the switch circuit includes: one or more first switches, each of the first switches being configured to connect each of the cathode electrodes of the first to eighth micro-LEDs to the power line of the bias voltage; and one or more second switches, each of the second switches being configured to connect each of the cathode electrodes of the first to eighth micro-LEDs to the power line of the negative voltage.

In accordance with some embodiments of the third aspect, the micro-LED display device further comprises a power management circuit configured to manage a level of the bias voltage so that a gap voltage as a difference between the negative voltage and the bias voltage is maintained at a value lower than a threshold voltage of each of the plurality of micro-LEDs.

Although some embodiments of the present disclosure have been described above with reference to the accompanying drawings, the present disclosure may not be limited to these embodiments and may be implemented in various different forms. Those of ordinary skill in the technical field to which the present disclosure belongs will be able to appreciate that the present disclosure may be implemented in other specific forms without changing the technical idea or essential features of the present disclosure. Therefore, it should be understood that these embodiments as described above are not restrictive but illustrative in all respects.

What is claimed is:

1. A micro-LED display device comprising:

a display panel including:

a plurality of pixel circuits configured to drive a plurality of micro-LEDs; and a micro-driver configured to control an operation of each of the plurality of pixel circuits; and a power management circuit configured to manage a level of a bias voltage so that a gap voltage as a difference between a negative voltage and the bias voltage used to selectively drive one of the plurality of micro-LEDs is maintained at a value lower than a threshold voltage of each of the plurality of micro-LEDs, wherein the power management circuit is configured to generate the bias voltage based on a negative feedback voltage fed back from the display panel and a gap setting signal corresponding to the gap voltage.

2. The micro-LED display device of claim 1, wherein the power management circuit is configured to generate the negative voltage and provide the generated negative voltage to the display panel.

3. The micro-LED display device of claim 2, wherein the power management circuit includes:

a first voltage generation circuit configured to generate the negative voltage based on an input voltage input from an external input power supply and a voltage setting signal; and a second voltage generation circuit configured to generate the bias voltage based on a reference voltage input from the external input power supply, the gap setting signal, and the negative feedback voltage.

4. The micro-LED display device of claim 3, wherein the second voltage generation circuit includes:

a digital-to-analog converter configured to receive the gap setting signal from an external setting unit and to convert the gap setting signal into the gap voltage; and a computation circuit configured to perform computation on the reference voltage, the gap voltage, and the negative feedback voltage to generate the bias voltage.

5. The micro-LED display device of claim 1, wherein the negative voltage is applied to a cathode electrode of a micro-LED from the plurality of micro-LEDs to emit light, the bias voltage is applied to the cathode electrode of a micro-LED from the plurality of micro-LEDs to not emit light, and the bias voltage is higher than the negative voltage.

6. The micro-LED display device of claim 1, wherein the display panel includes:

first to 16th row cathode electrodes spaced from each other by a predetermined spacing in a column direction, wherein each of first to 16th row cathode electrodes extends in a row direction of the display panel, wherein the micro-driver is between a column-directional arrangement of the first to 8th row cathode electrodes and a column-directional arrangement of ninth to 16th row cathode electrodes.

7. The micro-LED display device of claim 6, wherein the plurality of pixel circuits are on each of the first to 16th row cathode electrodes and are spaced from each other by a predetermined spacing in a row direction.

8. The micro-LED display device of claim 7, wherein the micro-driver is connected to each of the plurality of pixel circuits via a first anode electrode line and a second anode electrode line.

9. The micro-LED display device of claim 8, wherein the plurality of pixel circuits include:

first to eighth micro-LEDs connected to the micro-driver via first anode electrode lines, respectively; and first to eighth redundancy micro-LEDs connected to the micro-driver via second anode electrode lines, respectively.

10. The micro-LED display device of claim 1, wherein each of the plurality of pixel circuits includes:

a driving transistor configured to supply a power voltage in response to a gate driving voltage;

a first transistor configured to constitute a current path together with the driving transistor in response to a light-emission signal;

first to eighth micro-LEDs, each having an anode electrode connected to the first transistor; and a switch circuit configured to selectively connect each of cathode electrodes of the first to eighth micro-LEDs to a power line for the negative voltage or the bias voltage.

11. The micro-LED display device of claim 10, wherein the switch circuit includes:

one or more first switches, each of the one or more first switches configured to connect each of the cathode electrodes of the first to eighth micro-LEDs to a power line for the bias voltage; and one or more second switches, each of the one or more second switches being configured to connect each of the cathode electrodes of the first to eighth micro-LEDs to a power line for the negative voltage.

12. The micro-LED display device of claim 10, wherein the switch circuit is configured to apply the negative voltage to the cathode electrode of the micro-LED to emit light and to apply the bias voltage to the cathode electrode of each of remaining micro-LEDs not to emit light.

13. A micro-LED display device comprising:

a display panel including:

a plurality of pixel circuits for driving a plurality of micro-LEDs; and a micro-driver configured to control an operation of each of the plurality of pixel circuits, first to 16th row cathode electrodes extending in a row direction of the display panel and spaced from each by a predefined spacing in a column direction, wherein the micro-driver between a column-directional arrangement of the first to 8th row cathode electrodes and a column-directional arrangement of the ninth to 16th row cathode electrodes, further comprising a power management circuit configured to manage a level of a bias voltage so that a gap voltage as a difference between a negative voltage and the bias voltage used to selectively drive one of the plurality of micro-LEDs is maintained at a value lower than a threshold voltage of each of the plurality of micro-LEDs, wherein the power management circuit is configured to generate the bias voltage based on a negative feedback voltage fed back from the display panel and a gap setting signal corresponding to the gap voltage.

14. The micro-LED display device of claim 13, wherein the negative voltage is applied to a cathode electrode of a micro-LED from the plurality of micro-LEDs to emit light, the bias voltage is applied to the cathode electrode of a micro-LED from the plurality of micro-LEDs to not emit light, and the bias voltage is higher than the negative voltage.

15. The micro-LED display device of claim 14, wherein the power management circuit is configured to generate the negative voltage and provide the generated negative voltage to the display panel.

16. The micro-LED display device of claim 15, wherein the power management circuit includes:

a first voltage generation circuit configured to generate the negative voltage based on an input voltage input from an external input power supply and a voltage setting signal; and a second voltage generation circuit configured to generate the bias voltage based on a reference voltage input from the external input power supply, the gap setting signal, and the negative feedback voltage.

17. The micro-LED display device of claim 16, wherein the second voltage generation circuit includes:

a digital-to-analog converter configured to receive the gap setting signal from an external setting unit and to convert the gap setting signal into the gap voltage; and a computation circuit configured to perform computation on the reference voltage, the gap voltage, and the negative feedback voltage to generate the bias voltage.

18. A micro-LED display device comprising:

a display panel including:

a plurality of pixel circuits configured to drive a plurality of micro-LEDs; and a micro-driver configured to control an operation of each of the plurality of pixel circuits, wherein each of the plurality of pixel circuits includes:

a driving transistor configured to supply a power voltage in response to a gate driving voltage;

a first transistor configured to constitute a current path together with the driving transistor in response to a light-emission signal;

first to eighth micro-LEDs, each having an anode electrode connected to the first transistor; and a switch circuit configured to selectively connect each of cathode electrodes of the first to eighth micro-LEDs to a power line for a negative voltage or a bias voltage, further comprising:

a power management circuit configured to manage a level of the bias voltage so that a gap voltage as a difference between the negative voltage and the bias voltage is maintained at a value lower than a threshold voltage of each of the plurality of micro-LEDs, wherein the power management circuit is configured to generate the bias voltage based on a negative feedback voltage fed back from the display panel and a gap setting signal corresponding to the gap voltage.

19. The micro-LED display device of claim 18, wherein the switch circuit is configured to apply the negative voltage to a cathode electrode of the micro-LED to emit light, and to apply the bias voltage to a cathode electrode of each of remaining micro-LEDs not to emit light.

20. The micro-LED display device of claim 19, wherein the switch circuit includes:

one or more first switches, each of the one or more first switches configured to connect each of the cathode electrodes of the first to eighth micro-LEDs to the power line for the bias voltage; and one or more second switches, each of the one or more second switches configured to connect each of the cathode electrodes of the first to eighth micro-LEDs to the power line for the negative voltage.

* * * * *